United States Patent [19]

Collins

[11] 3,723,769

[45] Mar. 27, 1973

[54] SOLID STATE RELAY CIRCUIT WITH OPTICAL ISOLATION AND ZERO-CROSS FIRING

[75] Inventor: Howard William Collins, Santa Ana, Calif.

[73] Assignee: International Rectifier Corporation, Los Angeles, Calif.

[22] Filed: Nov. 1, 1971

[21] Appl. No.: 194,738

[52] U.S. Cl. ......307/252 UA, 307/252 B, 307/252 N, 307/252 T, 307/311

[51] Int. Cl. ..............................................H03k 17/56

[58] Field of Search ......307/252 B, 252 N, 252 T, 252 UA, 307/311; 250/214 R

[56] References Cited

UNITED STATES PATENTS

| | | | |
|---|---|---|---|
| 3,524,997 | 8/1970 | Harnden, Jr. et al. | 307/252 B |
| 3,649,849 | 3/1972 | McGuirk, Jr. | 307/252 UA |
| 3,328,606 | 6/1967 | Pinckaers | 307/252 B |
| 3,590,275 | 6/1971 | Fisher | 307/252 B |

*Primary Examiner*—John Zazworsky
*Attorney*—Sidney G. Faber et al.

[57] ABSTRACT

A solid state relay circuit is provided which has four terminals, two for power input, and two for signal input. The circuit consists of a full-wave diode bridge circuit having a pilot thyristor connected across its D.C. terminals. A firing control circuit also energized from these bridge terminals applies a firing signal to the thyristor gate responsive to the receipt of an input radiation signal from an optically isolated signal circuit connected to the signal input terminals, and causes the delivery of a firing signal to a thyristor or triac when the input voltage is near or at zero. Thus, the thyristor or triac in the relay output circuit begins to conduct under zero voltage conditions.

7 Claims, 3 Drawing Figures

INVENTOR.
HOWARD WILLIAM COLLINS
BY
Ostrolenk, Faber, Gerb & Soffen
ATTORNEYS

SOLID STATE RELAY CIRCUIT WITH OPTICAL ISOLATION AND ZERO-CROSS FIRING

BACKGROUND OF THE INVENTION

This invention relates to a solid state relay circuit, and more particularly relates to a novel relay circuit which can be actuated through an optical link and which uses relatively few circuit components.

Individual circuits are well known which employ, individually, various concepts which are combined in a novel manner into the circuit of the present invention. For example, it is known that it is advantageous for solid state relays to turn on at approximately zero voltage across the relay terminals so that the relay is not affected by the load power factor, and since turn-on at zero voltage will eliminate radio frequency interference. Furthermore, zero voltage operation, known as zero-cross firing, will limit the rate-of-rise-of-current through the load and in output semiconductor devices. Zero-cross firing circuits are described, for example, in U.S. Pat. No. 3,577,177.

Another feature which is integrally incorporated into the relay circuit of the invention is the use of optical isolation techniques, wherein the circuit is fired by a signal which is optically transmitted to a radiation-sensitive detector in the firing circuit. The use of optical coupling per se has been described, for example, in U.S. Pat. No. 3,493,761.

BRIEF SUMMARY OF THE INVENTION

In accordance with the present invention, the concept of optical isolation of the firing signal from the relay circuit, and the concept of zero-cross firing is applied in a novel and simplified manner within a full-wave rectifier bridge circuit which provides from the supply power all of the biasing voltages needed to operate the circuit components of the firing circuit.

The novel circuit may be used in combination either with thyristors connected in inverse parallel relation in series with the input source of power or in combination with a single triac or bidirectional semiconductor switch device which also would be connected in series with the input power source. These devices, whether thyristors or triacs, are then connected in closed series with the A.C. power and load, whereby, upon the generation of an optical signal in response, for example, to the energization of input terminals of the relay, a pilot thyristor connected to the D.C. terminals of the bridge becomes conductive (at approximately zero instantaneous input voltage), with the conduction of the thyristor generating trigger pulses for triggering the main thyristor or triac into conduction, thereby to create a significant current flow through the load.

DETAILED DESCRIPTION OF THE DRAWINGS

Figures 1, 2:
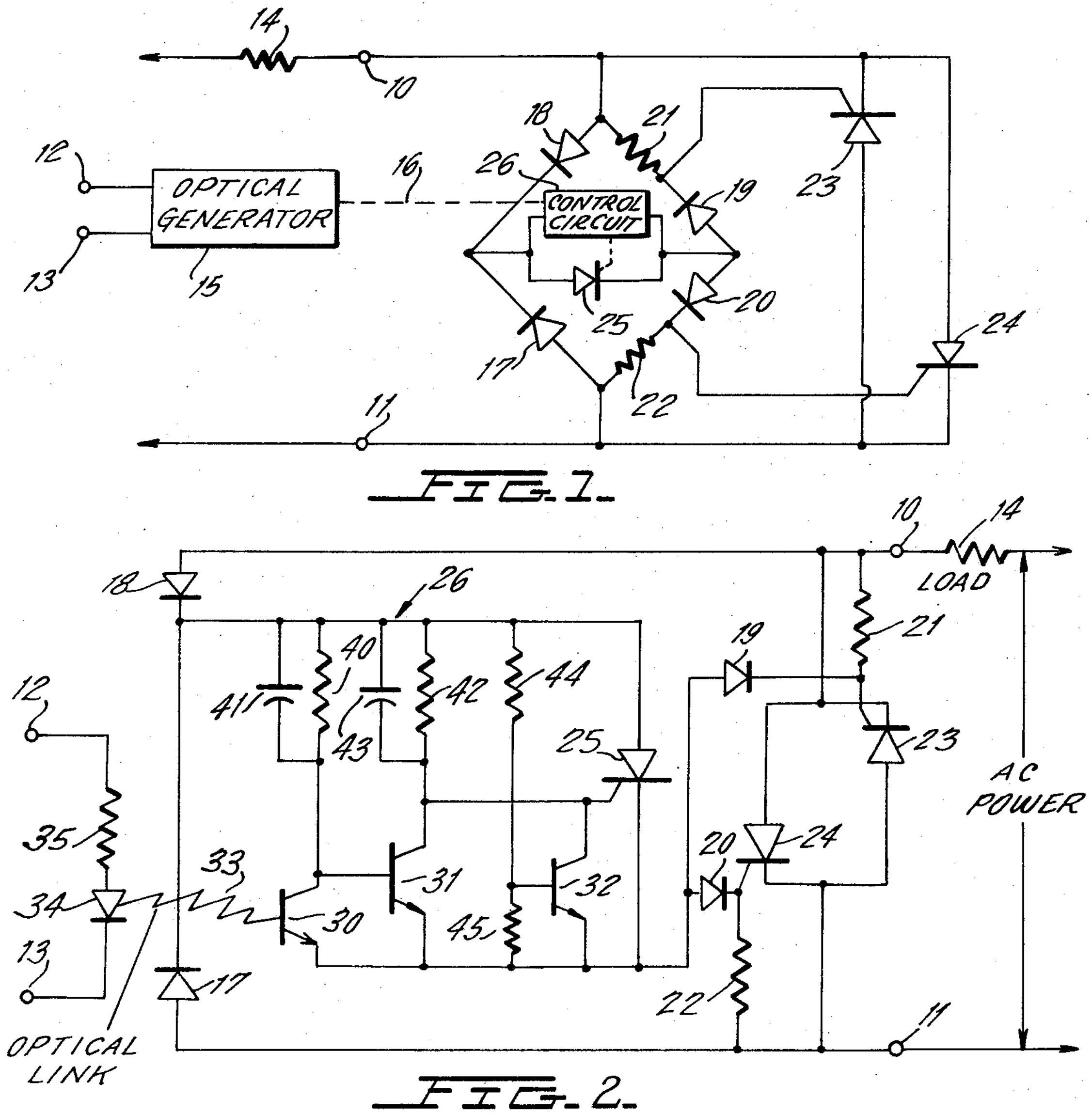
FIG. 1 schematically illustrates a bridge circuit which incorporates some of the elements of the present invention in combination with a load, and thyristor devices which are to be triggered in order to energize the load.
FIG. 2 is a detailed circuit diagram which shows the control circuit components for the circuit of FIG. 1 in combination with the main components of the circuit of FIG. 1 redrawn for purposes of simplicity.

Referring first to FIG. 1, there is shown a relay device circuit which contains four terminals 10, 11, 12 and 13. Terminals 10 and 11 are the input power terminals which are to be connected through a load 14 to a source of A.C. power, for example, a conventional 115 volt 60 cycle source. The load 14 is the load which is to be energized upon the "closing" of the relay. The other two terminals 12 and 13 of the relay are connected to an optical signal generator 15 which, upon energization of terminals 12 and 13, will produce a radiation signal such as a beam of light, schematically illustrated by dotted line 16. All components of the relay including terminals 10 to 13 may be mounted on a common housing structure.

Terminals 10 and 11 are connected to the A.C. terminals of a bridge-connected circuit formed by diodes 17, 18, 19 and 20. The legs of the bridge containing diodes 19 and 20 also contain series resistors 21 and 22. The junction between the cathode of diode 19 and resistor 21 is connected to the gate electrode of a thyristor 23 which is connected across terminals 10 and 11. In a similar manner, the junction between the cathode of diode 20 and resistor 22 is connected to the gate of thyristor 24 which is connected in inverse parallel relation to the thyristor 23 and again across the terminals 10 and 11.

A pilot thyristor 25 is then connected across the D.C. terminals of the bridge and the gate electrode of pilot thyristor 25 is actuated from a control circuit 26 which is also energized from the D.C. terminals of the bridge. The control circuit 26 is, in turn, one which is optically responsive, whereby it can be energized in response to the reception of optical radiation 16 from the generator 15, or in response to some particular characteristic imposed upon this light beam 16.

As will be seen more fully hereinafter in connection with FIG. 2, the control circuit is further constructed so that the thyristor 25 can be fired only when the instantaneous voltage between terminals 10 and 11 is approximately zero, thereby to avoid the creation of the RF interference which occurs when thyristors 23 and 24 fire on some significant voltage. Moreover, the use of an optical link 16 for energizing the control circuit provides improved electrical isolation, as compared, for example, to isolation transformers, and at relatively low cost provides true D.C. isolation from the generator 15. Moreover, since the circuit consists entirely of solid state devices, it will be apparent that the circuit will have long life, good signal sensitivity and resistance to shock and vibration, as compared, for example, to a reed relay. With the use of the novel optical isolation circuitry, it will also be understood that the relay of FIG. 1 is directly compatible with transistor digital logic signal levels.

The control circuit 26 is shown in more detail in FIG. 2, with the remainder of the circuit of FIG. 2 redrawn for purposes of simplicity. Control circuit 26 contains three transistors 30, 31 and 32, where the transistor 30 is a phototransistor which becomes conductive upon the reception of some input optical radiation signal, schematically shown as input light signal 33. This input light signal 33 may be generated, as by a light emitting diode 34 connected in series with terminals 12 and 13 and a current-limiting resistor 35. The light emitting diode 34 could, of course, be replaced by other light generating devices including incandescent lamps, neon lamps, shuttered light sources, and the like. Similarly, it will be seen more fully hereinafter that the phototransistor 30 could be replaced by devices such as a photodiode or photoresistor.

The collector of transistor 30 is connected to the base of transistor 31, and is further connected in series with the parallel-connected resistor 40 and capacitor 41. Transistor 31 is connected in series with the parallel-connected resistor 42 and capacitor 43 and the collector of transistor 31 is connected to the gate electrode of pilot thyristor 25. In addition, the collector of transistor 31 is connected to the collector of transistor 32, while the base of transistor 32 is connected to the mid-point of the resistive voltage divider consisting of resistors 44 and 45.

The operation of the circuit of FIG. 2 is as follows:

Under open relay conditions, there is no optical signal from the optical generator which includes light emitting diode 34 to the photo-sensitive transistor 30. Accordingly, the current flow through diodes 18 and 17 on alternate half cycles is taken through resistor 40 and capacitor 41 to the base of transistor 31, thereby causing transistor 31 to conduct. The conduction of transistor 31 then clamps the gate of thyristor 25 to its cathode to prevent thyristor 25 from being fired.

Accordingly, the thyristors 23 and 24 are in a high impedance state and there is no current flow to load 14.

It is to be noted that all of the power derived for the operation of the control circuit 26 is being derived from between the positive and negative terminals of the bridge.

Once there is a signal current through the light emitting diode 34, optical radiation 33 is applied to transistor 30, thereby to increase its conductivity. The conduction of transistor 30 couples the base of transistor 31 to its emitter, and further operates to bypass the flow of current from resistor 40 and capacitor 41 through the collector-emitter circuit of transistor 30 rather than through the base circuit of transistor 31. The transistor 31 is then turned off so that, when transistor 32 is also turned off, a firing signal can be applied to the pilot thyristor 25.

In accordance with one aspect of the invention, however, and in order to achieve zero-cross firing, the transistor 32 is maintained in a conductive condition by the application of a sufficient base signal from the voltage divider including resistors 44 and 45 when the instantaneous voltage at terminals 10 and 11 is relatively high, that firing signals are bypassed through the conducting transistor 32 during this time. However, once the line voltage decreases to a value sufficient to reduce the base voltage at transistor 32 sufficiently to cause transistor 32 to cut off, the condition now exists that both transistors 31 and 32 are cut off (are at a relatively high impedance value) so that the pilot thyristor 25 is fired by the gate-to-cathode signal across these transistors.

The conduction of the pilot thyristor 25 will then produce a voltage increase on either of resistors 21 or 22, depending upon which halve wave of the A.C. source is positive at the time the firing signal is received by the circuit. Thus, either of thyristors 23 or 24 will be fired at approximately zero voltage across the terminals 10 and 11, so that the load 14 is energized from the input source of power.

It should be noted that while thyristors 23 and 24 conduct, the voltage across the bridge terminals and thus the power dissipated in the control components is removed from the control circuit for the remainder of the half cycle. Moreover, it will be understood that the capacitors 41 and 43 operate to permit high current flow when the voltage between terminals 10 and 11 passes through zero so that the pilot thyristor 23 can be gated early in the cycle with a minimum loss of phase angle.

The resistors 44 and 45 cooperate with the transistor 32 to force the circuit to turn on only at the zero voltage crossing point, thereby to eliminate radio-frequency interference and to limit the rate-of-change-of-current through the load 14 and the output thyristors 23 and 24. Thus, whenever there is a significant voltage across the terminals 10 and 11, the base of transistor 32 is saturated, thereby to clamp the gate of pilot thyristor 25 to prevent its firing in any point other than in some narrow "window" near the zero voltage operating point of the cycle. As will be understood, the resistors 21 and 22 operate to bypass small quiescent currents which will flow through the firing circuit elements around the output semiconductor devices 23 and 24.

Figure 3:
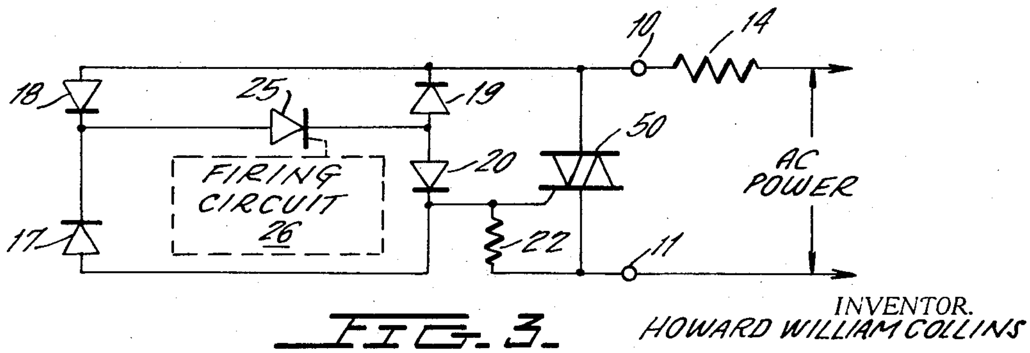
FIG. 3 shows a circuit similar to that of FIG. 1 where the main device to be triggered into conduction by the operation of the relay is a triac instead of thyristors as in FIG. 1.

FIG. 3 illustrates an embodiment of the invention in which the output semiconductor devices 23 and 24 are replaced by a bidirectional triac 50. All other circuit components in FIG. 3 which are similar to those of FIG. 2 are given similar identifying numerals. Thus, the major variations in the circuit of FIG. 3, as compared to the circuit of FIG. 2, is that the triac 50 replaces the thyristors 23 and 24, and moreover, that only a single connection is made to the gate of triac 50, this connection being taken from the junction between the cathode of diode 20 and resistor 22. Note that the resistor 21 is eliminated from the circuit of FIG. 3 since there is only a single gate to be operated.

The operation of the circuit of FIG. 3 will be substantially identical to that of the circuit of FIG. 2, with the triac 50 becoming conductive only at some "window" surrounding zero instantaneous current of the voltage applied between terminals 10 and 11.

Although this invention has been described with respect to preferred embodiments, it should be understood that many variations, and modifications will now be obvious to those skilled in the art and, therefore, the scope of this invention is to be limited not only by the specific disclosure herein, but only by the appended claims.

I claim:

1. A solid state relay circuit comprising, in combination:

a pair of power terminals connectable in series with a load and in series with an A.C. source of power;

controllably conductive semiconductor means having a pair of main electrodes and a control electrode; said pair of main electrodes connected to said pair of power terminals, respectively;

a single phase, full-wave bridge circuit having A.C. terminals and D.C. terminals; said pair of power terminals connected to said A.C. terminals; impedance means connected in at least one of the arms of said bridge circuit;

a pilot controllably conductive device having a pair of main terminals and a control terminal; said pair of main terminals of said pilot controllably conductive device being connected to said D.C. terminals, respectively, of said bridge circuit;

coupling circuit means for coupling a signal at said impedance means to said control electrode of said controllably conductive means, whereby said controllably conductive means becomes conductive in response to the conduction of said pilot controllably conductive device which affects the signal at said impedance means;

a control circuit having output means connected to said control terminal of said pilot controllably conductive device; said control circuit being connected to and deriving energy from said D.C. terminals of said bridge circuit; said control circuit further including optically responsive circuit means, whereby incident radiation upon said optically responsive circuit means produces an output signal in said output means for causing said pilot controllably conductive device to conduct;

optical generator means optically coupled to said control circuit; said optical generator means having first and second output terminals for receiving input signals for the operation of said relay circuit;

and zero-cross firing circuit means coupled between said D.C. terminals and said pilot controllably conductive device for allowing conduction of said pilot controllably conductive device only at a time of approximately zero instantaneous voltage between said pair of power terminals.

2. The relay circuit of claim 1 wherein said pilot controllably conductive device is a thyristor.

3. The relay circuit of claim 2 wherein said controllably conductive semiconductor means consists of a pair of inversely connected thyristors.

4. The relay circuit of claim 2 wherein said controllably conductive semiconductor means consists of a triac.

5. The relay circuit of claim 1 wherein said control circuit includes first, second and third parallel circuit connected between said D.C. terminals; said first circuit including a first parallel-connected combination of a resistor and capacitor connected in series with an optically sensitive impedance means which defines said optically responsive circuit means; said second circuit including a second parallel-connected combination of a resistor and capacitor connected in series with the collector-emitter of a first transistor; said third circuit comprising a resistor divider, and a second transistor; the collector-emitter circuit of said second transistor connected between said control electrode of said pilot controllably conductive device and one of said D.C. terminals; said optically sensitive impedance means connected between the base and emitter electrodes of said first transistor; said collector of said first transistor connected to said control electrode of said pilot controllably conductive device.

6. The relay circuit of claim 5 wherein said optically sensitive impedance means consists of a phototransistor.

7. A zero-cross firing circuit for firing a controllably conductive device only at about zero instantaneous voltage across said device; said firing circuit including rectifier circuit means connected in series with said controllably conductive device, said rectifier circuit having D.C. output terminals, and control circuit means connected across said D.C. output terminals; said controllably conductive device having a control electrode; said control circuit means being coupled to said control electrode of said device and including first, second and third parallel circuits connected between said D.C. terminals; said first circuit including a first parallel-connected combination of a resistor and capacitor connected in series with an optically sensitive impedance means; said second circuit including a second parallel-connected combination of a resistor and capacitor connected in series with the collector-emitter of a first transistor; said third circuit comprising a resistor divider, and a second transistor; the collector-emitter circuit of said second transistor connected between said control electrode of said controllably conductive device and one of said D.C. terminals; said optically sensitive impedance means connected between the base and emitter electrodes of said first transistor; said collector of said first transistor connected to said control electrode of said controllably conductive device.

* * * * *